United States Patent
Anosov et al.

(10) Patent No.: US 10,991,870 B2
(45) Date of Patent: Apr. 27, 2021

(54) METHOD OF PRODUCTION OF THERMOELECTRIC MICRO-COOLERS (VARIANTS)

(71) Applicant: RMT Limited, Nizhniy Novgorod (RU)

(72) Inventors: Vasilii Sergeevich Anosov, Moscow (RU); Mikhail Petrovich Volkov, Moscow (RU); Alexander Aleksandrovich Nazarenko, Moscow (RU); Denis Yevgenievich Surov, Moscow region (RU)

(73) Assignee: RMT LIMITED, Nizhniy Novgorod (RU)

( * ) Notice: Subject to any disclaimer, the term of this patent is extended or adjusted under 35 U.S.C. 154(b) by 0 days.

(21) Appl. No.: 16/233,271

(22) Filed: Dec. 27, 2018

(65) Prior Publication Data
US 2019/0296208 A1 Sep. 26, 2019

(30) Foreign Application Priority Data
Mar. 21, 2018 (RU) .......................... RU2018109990

(51) Int. Cl.
*H01L 35/34* (2006.01)
*H01L 35/32* (2006.01)

(52) U.S. Cl.
CPC .............. *H01L 35/34* (2013.01); *H01L 35/32* (2013.01)

(58) Field of Classification Search
CPC ................................. H01L 35/34; H01L 35/32
See application file for complete search history.

(56) References Cited

U.S. PATENT DOCUMENTS

| | | | |
|---|---|---|---|
| 6,127,619 A | 10/2000 | Xi et al. | |
| 6,274,803 B1* | 8/2001 | Yoshioka | H01L 35/32 136/201 |
| 6,347,521 B1* | 2/2002 | Kadotani | F25B 21/02 136/204 |
| 6,410,840 B1* | 6/2002 | Sudo | H01L 35/16 136/201 |
| 7,531,739 B1* | 5/2009 | Moczygemba | H01L 35/34 136/201 |

(Continued)

FOREIGN PATENT DOCUMENTS

RU 81379 U1 1/2000

*Primary Examiner* — Golam Mowla
(74) *Attorney, Agent, or Firm* — Cantor Colburn LLP

(57) ABSTRACT

The present invention relates to thermoelectric apparatuses for the production of thermoelectric coolers in radio electronics, medicine, and devices that are used in the conditions of repeatable temperature cycling (heating-cooling). The method of production of a thermoelectric micro-cooler includes forming on a first ceramic wafer a first conductive layer containing conductive traces; soldering legs of thermoelectric material to the conductive traces of the first conductive layer: forming on a temporary wafer a second conductive layer containing conductive traces: soldering the conductive traces of the second conductive layer to the legs of thermoelectric material; applying to the legs of thermoelectric material and soldered joints a protective coating; etching the temporary wafer; applying onto the second ceramic wafer an elastic conductive adhesive layer; adhering the second ceramic wafer to the conductive traces of the second conductive layer.

5 Claims, 4 Drawing Sheets

(56) References Cited

U.S. PATENT DOCUMENTS

| | | | | |
|---|---|---|---|---|
| 2004/0195934 A1* | 10/2004 | Tanielian | ................ | H01L 35/00 310/306 |
| 2004/0261830 A1* | 12/2004 | Sharp | ...................... | H01L 35/34 136/201 |
| 2005/0139249 A1* | 6/2005 | Ueki | ...................... | H01L 35/34 136/211 |
| 2006/0107989 A1* | 5/2006 | Bierschenk | ............. | H01L 35/32 136/212 |

* cited by examiner

METHOD OF PRODUCTION OF THERMOELECTRIC MICRO-COOLERS (VARIANTS)

The present invention relates to thermoelectric apparatuses and can be used for the production of thermoelectric coolers applicable in radio electronics, medicine, and devices which are exploited, preferably, in the conditions of repeatable temperature cycling (heating-cooling).

It is known the thermoelectric cooler (TEC) (see RU Patent 81379 U1, IPC H01L35/28, published 10 Mar. 2009) for use advantageously under repeated thermocycling, comprising legs of thermoelectric material connected via switch buses to cooling and ceramic heat wafers. Each switch bus is mounted on at least one of the ceramic wafers and is attached thereto by means of a thermal contact connection made as a layer of an elastic adhesive compound or with an additional adhesive sub-layer. The method of production of the known cooler includes the following:
- soldering legs of the thermoelectric material to switch buses of the lower ceramic wafer of the TEC,
- applying the adhesive layer on the top ceramic wafer by the screen printing,
- adhering the switch buses to the top ceramic wafer,
- soldering the top ceramic wafer with the switch buses adhered thereto to the lower ceramic wafer with the legs of the thermoelectric material.

This method of production has several important drawbacks. This method requires the individual production of switch buses with a respective soldering coating on a thermoelectric material leg. Adhering the switch buses to the top ceramic wafer is a laborious process. While soldering the switch buses, the adhesive compound on the thermoelectric material leg undergoes a significant temperature impact (above 200° C.). In addition, the known method relates to so-called "large-size" TECs having quite large geometrical dimensions (legs of such modules have a section size of 1×1 mm² and more, and the ceramic elements have dimensions of more than 15×15 mm²). Large legs and ceramics facilitate the assemblage of such TECs because, in this case, it gives a way to use conductive traces in the form of individual components ("buses") which, due to large dimensions, are easily installed and adhered to the rest of the TEC parts.

Chosen as a prototype is the known method for producing thermoelectric micro-coolers (see U.S. Pat. No. 6,127,619, IPC H01L 35/28, H01L 35/34, published on 3 Oct. 2000), comprising
- fabricating conductive traces on the first ceramic wafer,
- fabricating legs of thermoelectric material on the conductive traces of the first ceramic wafer,
- fabricating the layer of a topology of conductive traces on the legs of thermoelectric material,
- affixing the second ceramic wafer atop of the conductive traces.

The shortcoming of this method for producing thermoelectric micro-coolers is the unpreparedness for repeatable temperature cycling of finished micro-coolers. Moreover, in micro-coolers the use of individual switch buses is associated with several complications in terms of small dimensions and the production, positioning and adhering process of such buses.

The object of the present invention is to address the technical problem by providing a miniature thermoelectric cooler with improved reliability.

The technical effect achieved by the present invention serves the purpose of facilitating the production and positioning of a conductive layer on legs of thermoelectric material and of improving the thermal cycling resistance of TEC by excluding the thermal impact on elastic heat-conducting adhesive.

The technical effect is achieved by that the method of production of a thermoelectric micro-cooler includes forming on a first ceramic wafer a first conductive layer containing conductive traces; soldering legs of thermoelectric material to the conductive traces of the first conductive layer; forming on a temporary wafer a second conductive layer containing conductive traces: soldering the conductive traces of the second conductive layer to the legs of thermoelectric material; applying to the legs of thermoelectric material and soldered joints a protective coating; etching the temporary wafer; applying onto the second ceramic wafer an elastic conductive adhesive layer; adhering the second ceramic wafer to the conductive traces of the second conductive layer.

Optionally, an additional step of applying an adhesive layer onto the conductive traces of the second conductive layer and onto the second ceramic wafer is provided between the step of etching the temporary wafer and the step of applying onto the second ceramic wafer the layer of elastic conductive adhesive.

Further, in parallel with the step of adhering the second ceramic wafer to the conductive traces of the second conductive layer, a step of controlling an adhesive layer thickness is additionally conducted.

In accordance with a second embodiment, the method of production of the thermoelectric micro-cooler includes forming on a first ceramic wafer a first conductive layer containing conductive traces; soldering legs of thermoelectric material to the conductive traces of the first conductive layer; forming on a temporary wafer a second conductive layer containing conductive traces; soldering the conductive traces of the second conductive layer to legs of thermoelectric material; mechanically removing the temporary wafer; applying an elastic conductive adhesive layer onto the second ceramic wafer; adhering the second ceramic wafer to the conductive traces of the second conductive layer.

Next, the present invention will be described in details with references to the drawings showing steps of the method of production of a thermoelectric micro-cooler.

Figure 1:
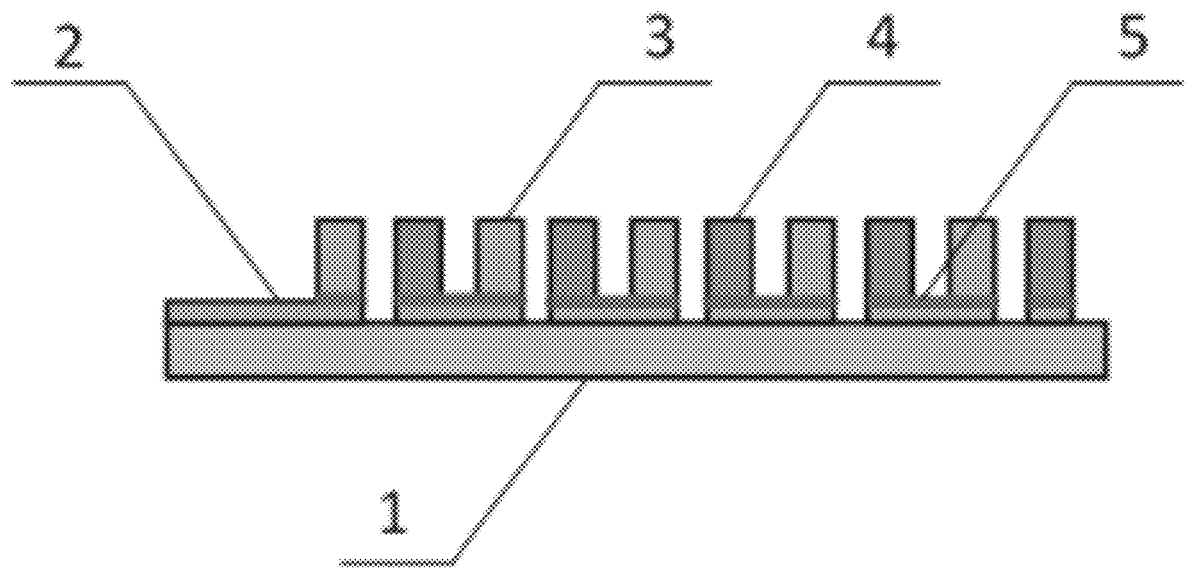
FIG. 1 is a step of soldering legs of thermoelectric material to conductive traces of a first conductive layer.
Figure 2:
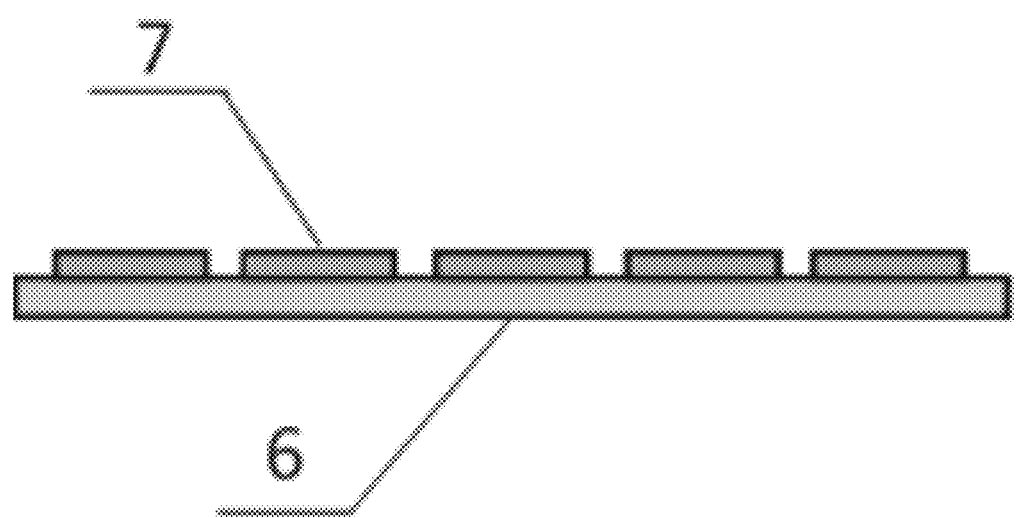
FIG. 2 is a step of forming on a temporary wafer a second conductive layer containing conductive traces.
Figure 3:
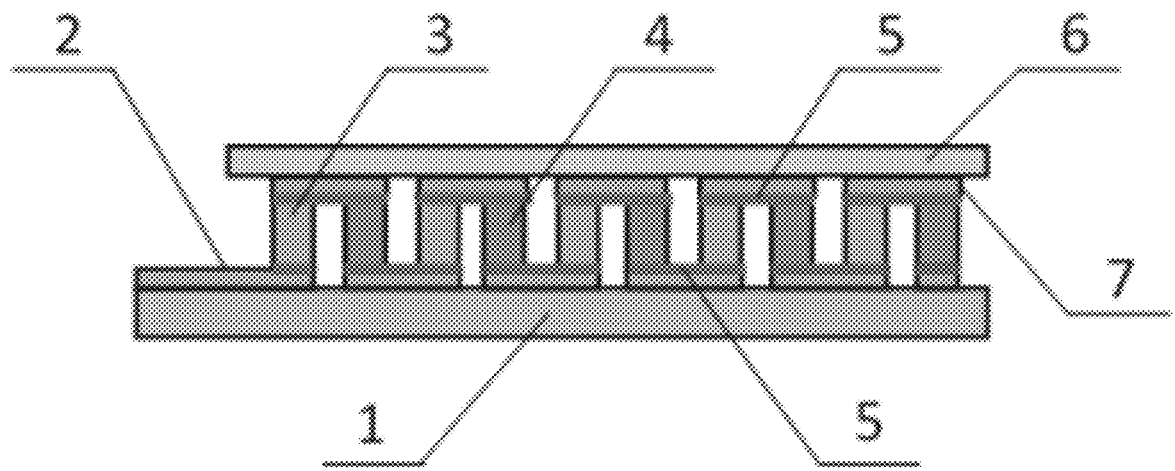
FIG. 3 is a step of soldering the conductive traces of the second conductive layer to legs of thermoelectric material.
Figure 4:
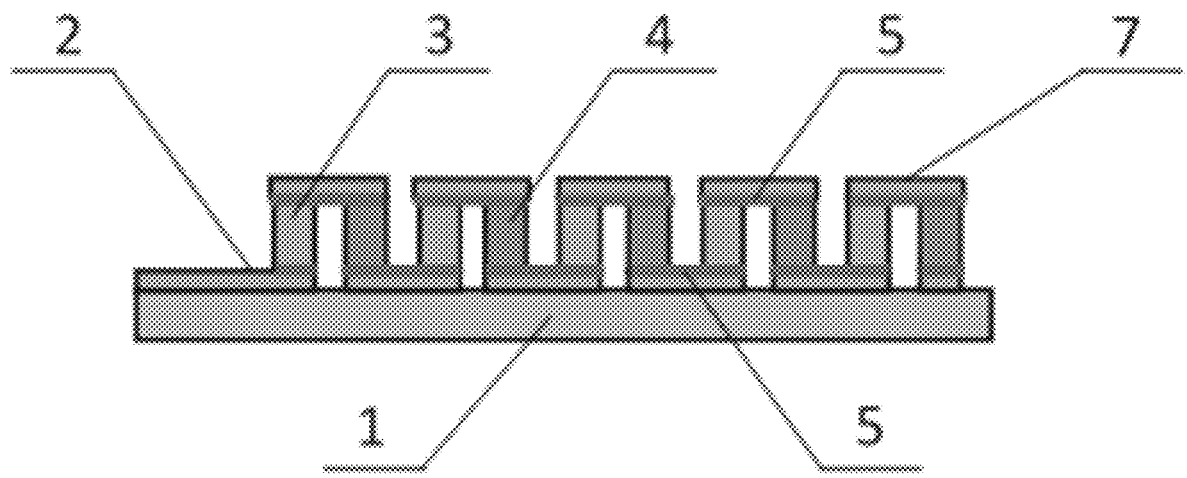
FIG. 4 is a step of etching the temporary wafer.
Figure 5:
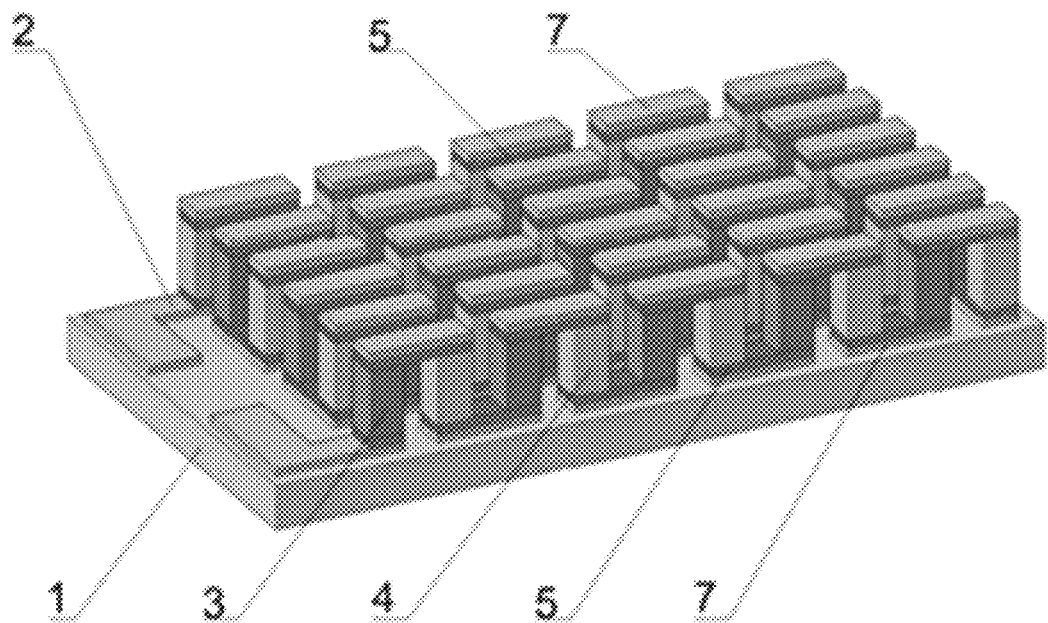
FIG. 5 is an overview of the micro-cooler after the etching step.
Figure 6:
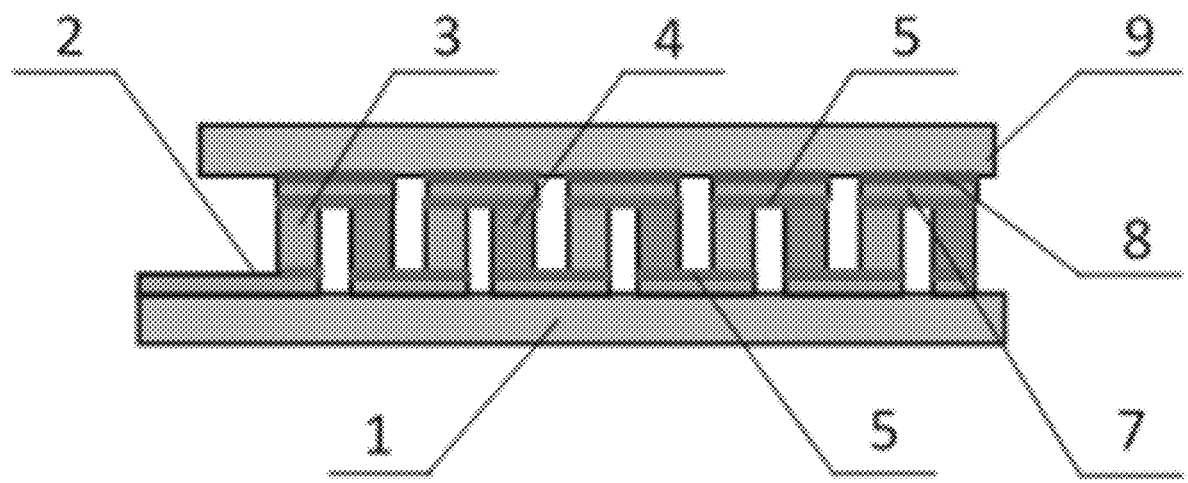
FIG. 6 is a step of adhering the second ceramic wafer.

The method is implemented as described below. On s first ceramic wafer (1) which is a substrate of a ceramic material, a first conductive layer containing first conductive traces (2) is formed. Legs of thermoelectric material of N-(3) and P-type (4) are soldered to the conductive traces on the formed conductive layer (2) using solder paste (5). Then, a temporary wafer (6) with a second conductive layer formed thereon containing second conductive traces (7) is soldered to the legs (3) and (4) of thermoelectric material. The temporary wafer (6) can be polyimide, lavsan or any other material which in the context of the described technique is a temporary support of the conductive traces (7) and further has to be mechanically or chemically removed. The second conductive layer containing the second conductive traces (7) can be adhered, embedded or burnt into the temporary wafer (6). Prior to the chemical removal of the temporary wafer (6) by group etching, the legs (3) and (4) of thermoelectric material and the soldered joints are protected from etching solution by means of a protective coating (the coating is applied by a group method). The temporary wafer (6) is etched. Another option to remove the temporary wafer (6) is a mechanical (e.g., by tearing off) removal after soldering the second conductive traces (7) to the legs (3) and (4) of thermoelectric material. Then, an adhesive sublayer (not shown) is applied onto both surfaces to be adhered together to a second ceramic wafer (9) and the conductive traces (7). This step is optional, however, the presence of the adhesive sublayer aids to improve the TEC reliability owing to the increased mechanical strength which is about 50% higher than that obtained in the manufacture without the use of the sublayer. In the next step, an elastic conductive adhesive layer (8) is applied onto the second ceramic wafer (9), e.g., by screen printing or as a continuous layer. In the final step, the second ceramic wafer (9) is adhered by means of the elastic conductive adhesive (8) to the formed structure containing the conductive traces (7), wherein a thickness of the adhesive layer is controlled in the range of 30 to 50 μm. It is the adhesive layer that makes the thermoelectric micro-cooler elastic, owing to which thermo-mechanical stresses in the module arisen under repeated thermocycling can be compensated.

As the adhering the second ceramic wafer (9) comes as the final step of the described method, the adhesive (8) during the micro-cooler manufacture can't be exposed to the temperatures above 50° C. This is beneficial for the adhesive material elasticity, because the upper limit of operating temperatures of the most of adhesives is 200° C. *maximum*, and when the temperatures of such adhesives exceed the limit of 200° C. physical and chemical properties (e.g., elasticity) of the adhesive layer may not be preserved.

Example of the Specific Embodiments

Modules 1MDL06-050-03 have been fabricated both according to a standard technique (without an adhesive layer) and according to the method of the present invention.

Table 1 demonstrates comparative characteristics of these modules.

TABLE 1

| Measured No | parameter | System | Measurement mode | Measurement results TEC fabricated according to the method of the present invention | Standard TEC |
|---|---|---|---|---|---|
| 1 | $R_{AC}$, Ohm | DX4190 Z-Meter | In the air, $T = 27°$ C. | 0.85 | 0.91 |
| 2 | Z × 1000, 1/K | | | 2.63 | 2.65 |
| 3 | τ, sec | | | 0.27 | 0.27 |
| 4 | ΔT at 4.5 A, K | Direct measurement system | Expert, at fixed current values | 60.74 | 57.56 |
| 5 | ΔT, K | DX8020 | Expert, at an operating point | 40 | 40 |
| 6 | Q, W | | | 0.3 | 0.3 |
| 7 | I, A | | | 1.990 | 1.964 |

TABLE 1-continued

| Measured No | parameter | System | Measurement mode | Measurement results TEC fabricated according to the method of the present invention | Standard TEC |
|---|---|---|---|---|---|
| 8 | U, V | | | 2.336 | 2.473 |
| 9 | W, W | | | 4.649 | 4.857 |

The Table above shows the following:
electrical resistance $R_{AC}$ in TEC is different by 7%,
thermoelectric figure of merit, Z, is better than tat of a standard TEC (by 0.8%),
temperature drop, ΔT, at the fixed current value of 4.5 A is higher than that of a TEC fabricated according to the inventive method,
power consumption, W, at an operating point is lower (by 4.5%) for a TEC fabricated according to the inventive method.

In this way, it can be stated that TECs fabricated according to the inventive method have electrical parameters which are the same as similar standard TECs have.

Modules 1MC06-126-05 fabricated according to the inventive method, as well as standard modules (without an adhesive layer) can undergo comparative tests for resistance to temperature cycles. Test parameters are the following:
the base (hot TEC side) temperature—40° C.,
the upper temperature of the cold TEC side—100° C.,
the lower temperature of the cold TEC side—20° C.,
cycling rate—2 cycles per minute.

Figure 7:
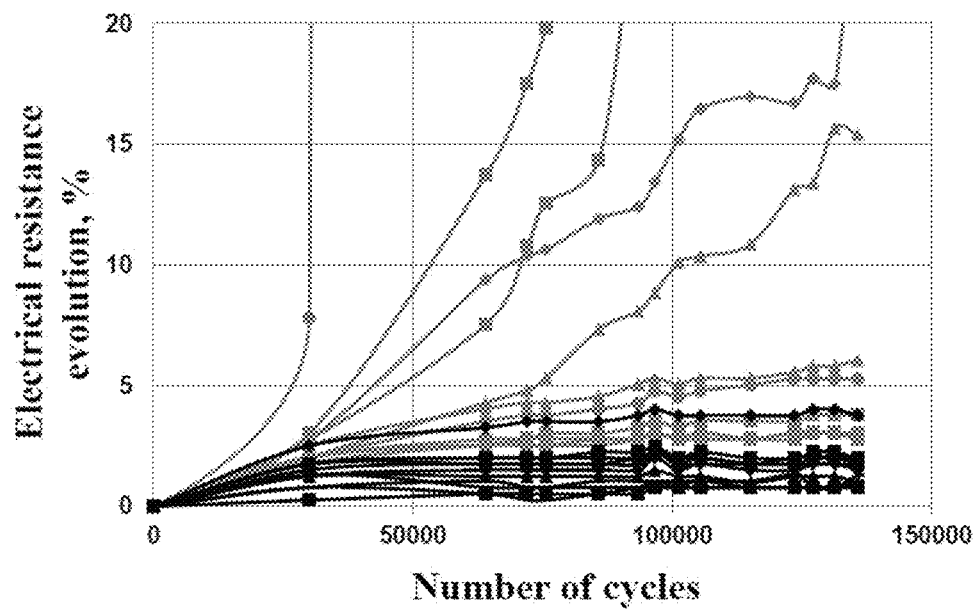
FIG. 7 is a comparative plot of test results for thermoelectric coolers.

FIG. 7 shows intermediate test results for modules fabricated according to the standard (in gray) and inventive (in black) methods. It can be seen that the electrical resistance of more than half standard modules (without the adhesive bonding) exceeds the 5%-limit, i.e., standard modules have failed these tests. At the same time, the electrical resistance of all TECs according to the inventive method lies within the 5% limit.

TECs according to the second embodiment of the method of the present invention which comprises the mechanical removal of the wafer (6) have lower characteristics, because adhesive can be removed only partially (when the temporary wafer (6) and the conductive traces (7) of the conductive layer adhered thereto are separated by mechanical means) or the legs (3) and (4) of thermoelectric material can be damaged (when the temporary wafer (6) and the embedded/burnt-in conductive traces (7) of the conductive layer are separated by mechanical means). However, despite some shortcomings, this method of production of a micro-cooler can be implemented in the industrial scale, too.

The invention claimed is:

1. A method of production of a thermoelectric micro-cooler, comprising
forming on a first ceramic wafer a first conductive layer containing conductive traces,
soldering legs of thermoelectric material to the conductive traces of the first conductive layer,
forming on a temporary wafer a second conductive layer containing conductive traces,
soldering the conductive traces of the second conductive layer to legs of thermoelectric material,
applying a protective coating onto the legs of thermoelectric material and soldered joints, removing the temporary wafer,
applying an elastic heat-conductive adhesive layer onto a second ceramic wafer,
adhering the second ceramic wafer to the conductive traces of the second conductive layer.

2. The method according to claim 1, wherein an additional step of applying an adhesive layer onto the conductive traces of the second conductive layer and onto the second ceramic wafer is provided between the step of removing the temporary wafer and the step of applying onto the second ceramic wafer the layer of elastic heat-conductive adhesive.

3. The method according to claim 1, wherein in parallel with the step of adhering the second ceramic wafer to the conductive traces of the second conductive layer, a step of controlling an adhesive layer thickness is conducted.

4. The method according to claim 1, wherein said removing the temporary wafer is by mechanical means.

5. The method according to claim 1, wherein said removing the temporary wafer is by etching.

* * * * *